(12) United States Patent
Fuchida et al.

(10) Patent No.: US 11,271,369 B2
(45) Date of Patent: Mar. 8, 2022

(54) SEMICONDUCTOR LASER AND METHOD FOR MANUFACTURING SAME

(71) Applicant: Mitsubishi Electric Corporation, Tokyo (JP)

(72) Inventors: Ayumi Fuchida, Tokyo (JP); Naoki Nakamura, Tokyo (JP); Go Sakaino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 36 days.

(21) Appl. No.: 16/967,724

(22) PCT Filed: Apr. 4, 2018

(86) PCT No.: PCT/JP2018/014410
§ 371 (c)(1),
(2) Date: Aug. 5, 2020

(87) PCT Pub. No.: WO2019/193679
PCT Pub. Date: Oct. 10, 2019

(65) Prior Publication Data
US 2021/0044090 A1    Feb. 11, 2021

(51) Int. Cl.
*H01S 5/227*    (2006.01)
*H01S 5/22*     (2006.01)

(52) U.S. Cl.
CPC .......... *H01S 5/227* (2013.01); *H01S 5/2206* (2013.01)

(58) Field of Classification Search
CPC ..... H01S 5/2222; H01S 5/2206; H01S 5/2224
(Continued)

(56) References Cited

U.S. PATENT DOCUMENTS 5,102,825 A * 4/1992 Brennan .............. H01S 5/227
                                                    438/36
5,488,233 A * 1/1996 Ishikawa ............. B82Y 20/00
                                                    257/201
(Continued)

FOREIGN PATENT DOCUMENTS

JP    H01300581 A    12/1989
JP    H04293286 A    10/1992
(Continued)

OTHER PUBLICATIONS

International Search Report issued in PCT/JP2018/014410; dated Jun. 26, 2018.

*Primary Examiner* — Tuan N Nguyen
(74) *Attorney, Agent, or Firm* — Studebaker & Brackett PC

(57) ABSTRACT

What is provided are: an active-layer ridge which is composed of an n-type cladding layer, an active layer, a first p-type cladding layer and a second n-type blocking layer that are stacked in this order on an n-type InP substrate, and which is formed to project from a position lower than the active layer; burying layers by which both side portions of the active-layer ridge are buried up to a position higher than the active layer; first n-type blocking layers which are each stacked on a front-surface side of each of the burying layers, to be placed on the both sides of the ridge; and a second p-type cladding layer by which an end portion of the active-layer ridge and the first n-type blocking layers are buried thereunder; wherein a current narrowing window for allowing a hole current to pass therethrough is provided in and at a center of the second n-type blocking layer placed at a top of the active-layer ridge.

19 Claims, 12 Drawing Sheets

(58) Field of Classification Search
USPC .................................................. 372/44.01
See application file for complete search history.

(56) References Cited

U.S. PATENT DOCUMENTS

| | | | |
|---|---|---|---|
| 2002/0136253 A1 | 9/2002 | Iwai et al. | |
| 2011/0164641 A1 | 7/2011 | Yoshida et al. | |
| 2014/0302628 A1 | 10/2014 | Takeuchi et al. | |
| 2015/0037919 A1* | 2/2015 | Ishiura .................. | H01S 5/3213 438/39 |

FOREIGN PATENT DOCUMENTS

| | | |
|---|---|---|
| JP | H05129723 A | 5/1993 |
| JP | 2000049413 A | 2/2000 |
| JP | 2000082861 A | 3/2000 |
| JP | 2011249766 A | 12/2011 |
| JP | 2015029025 A | 2/2015 |
| JP | 2017108061 A | 6/2017 |

\* cited by examiner

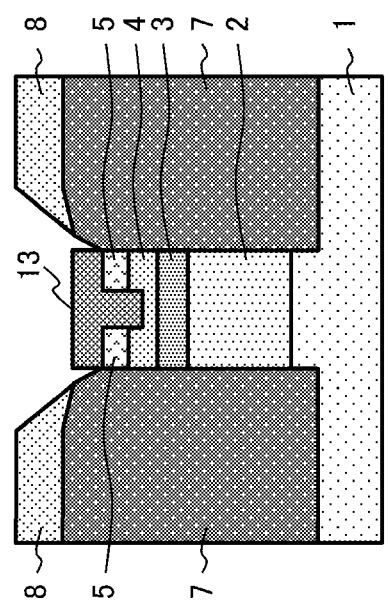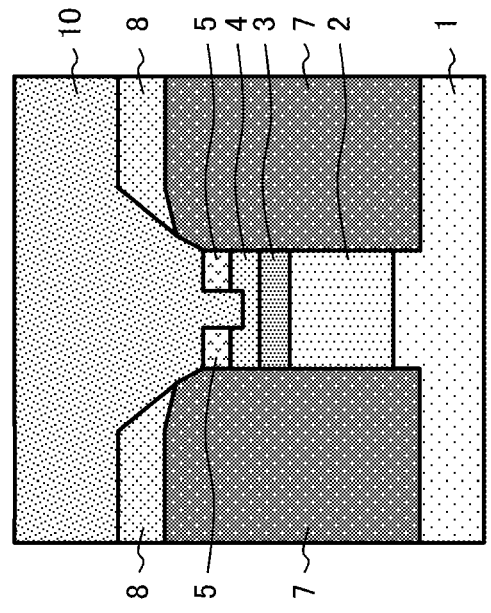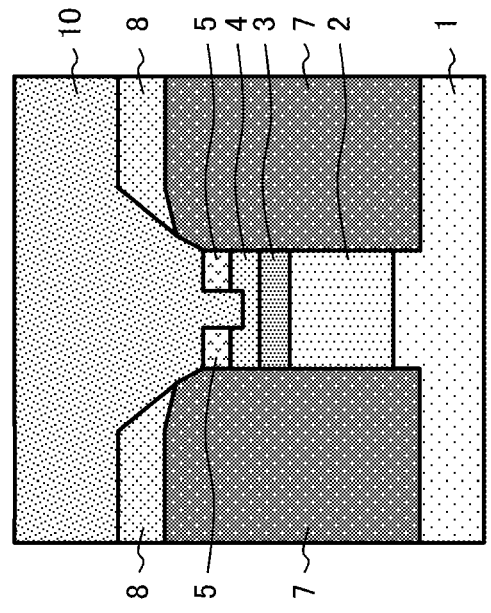

SEMICONDUCTOR LASER AND METHOD FOR MANUFACTURING SAME

TECHNICAL FIELD

The present application relates to a semiconductor laser having a semi-insulative burying and blocking layer, and a manufacturing method thereof.

BACKGROUND ART

A conventional semiconductor laser is so configured that: side surfaces of a ridge stripe structure in which an n-type InP cladding layer, an active layer and a first p-type InP cladding layer are stacked in this order on an n-type InP substrate, are buried by semi-insulative InP layers and n-type InP blocking layers placed thereon; and further, the ridge stripe structure and such burying layers consisting of the semi-insulative InP layers and the n-type InP blocking layers placed thereon, are buried by a second p-type InP cladding layer (see, for example, Patent Document 1).

With application of a current to such a semiconductor laser, holes are supplied from the second p-type InP cladding layer and flow toward the n-type InP substrate. On this occasion, a part of the holes is blocked by a potential barrier placed at the interface between the second p-type InP cladding layer and each n-type InP blocking layer, to thereby flow along the n-type InP blocking layer toward the active layer placed in the ridge stripe. In the active layer, electrons supplied from the n-type InP cladding layer are recombined with holes supplied from the second p-type InP cladding layer, making it possible to achieve light power and gain. In order to increase the power, it is effective to inject holes efficiently into the active layer by shortening the distance between the n-type InP blocking layer and the active layer (width of a hole leakage path).

For example, according to Patent Document 2, the width of the hole leakage path is narrowed in such a manner that, after the side surfaces of the ridge stripe are buried by the semi-insulative InP-burying layers and the n-type InP blocking layers, both side portions of the p-type InP cladding layer in the ridge stripe are etched and then n-type InP blocking layers are newly grown thereover, so that the hole leakage that is not contributing to light emission is suppressed.

CITATION LIST

Patent Document

Patent Document 1: Japanese Patent Application Laid-open No. 2017-108061 (Paragraphs 0014 to 0018; FIG. 5)
Patent Document 2: Japanese Patent Application Laid-open No. 2011-249766 (Paragraphs 0020 to 0027; FIG. 2 and FIG. 3)

SUMMARY OF THE INVENTION

Problems to be Solved by the Invention

According to the semiconductor laser in Patent Document 1, at the time of application of the current to the semiconductor laser, holes blocked by the n-type InP blocking layer will, during flowing through the first p-type InP cladding layer toward the active layer, get spread widthwise. Thus, there is a problem that a part of these holes is not injected into the active layer, resulting in increase of a useless hole-leakage current that is not contributing to light emission. Further, according to the semiconductor laser in Patent Document 2 the object of which is to solve the problem associated with Patent Document 2, there is a problem that crystal growth of n-type InP blocking layer has to be performed twice separately, resulting in increase of the number of production steps and increase of the manufacturing cost.

The present application is presented to disclose a technique for solving the problems as described above, and an object thereof is to provide a semiconductor laser which is capable of increasing the power by reducing the hole-leakage current, with no increase in the number of times of the crystal growth, and a manufacturing method thereof.

Means for Solving the Problems

A semiconductor laser disclosed in this application is characterized by comprising: a ridge which includes semiconductor layers of an n-type cladding layer, an active layer, a first p-type cladding layer and a second n-type blocking layer that are stacked in this order on an n-type substrate, and which is formed to project from a position nearer to the n-type substrate than to the active layer; burying layers by which both side portions of the ridge are buried up to a position higher than the active layer; first n-type blocking layers which are each stacked on a front-surface side of each of the burying layers, to be placed on both sides of the ridge; and a second p-type cladding layer by which a top of the ridge and the first n-type blocking layers are buried thereunder; wherein a current narrowing window for allowing a hole current to pass therethrough is provided in and at a center of the second n-type blocking layer placed at the top of the ridge.

Further, a semiconductor laser disclosed in this application is characterized by comprising: a ridge which is composed of an n-type cladding layer, an active layer and a first p-type cladding layer that are stacked in this order on an n-type substrate, and which is formed to project from a position nearer to the n-type substrate than to the active layer; burying layers by which both side portions of the ridge are buried up to a position higher than the active layer; first n-type blocking layers which are each stacked on a front-surface side of each of the burying layers, to be placed on both sides of the ridge; a second p-type cladding layer by which a top of the ridge and the first n-type blocking layers are buried thereunder; and a current narrowing window for allowing a hole current to pass therethrough, which is provided in and at a center of the first p-type cladding layer placed at the top of the ridge; wherein the current narrowing window is formed in such a manner that, in the first p-type cladding layer, a region corresponding to the region other than the current narrowing window is converted into an insulator.

A method for manufacturing a semiconductor laser disclosed in this application is characterized by comprising: a step of stacking an n-type cladding layer, an active layer, a first p-type cladding layer and a second n-type blocking layer, in this order, on an n-type substrate, and thereafter, etching both side portions of thus stacked layers up to a position nearer to the n-type substrate than to the active layer, to thereby form a ridge; a step of burying both side portions of the ridge by burying layers, up to a position higher than the active layer; a step of growing a first n-type blocking layer on each of the burying layers; and a step of providing a current narrowing window in and at a center of the second n-type blocking layer placed at a top of the ridge.

Further, a method for manufacturing a semiconductor laser disclosed in this application is characterized by comprising: a step of stacking an n-type cladding layer, an active layer, a first p-type cladding layer and a second n-type blocking layer, in this order, on an n-type substrate, and thereafter, providing a current narrowing window in and at a center of the second n-type blocking layer; a step of etching both side portions of thus stacked layers up to a position nearer to the n-type substrate than to the active layer, to thereby form a ridge so that the current narrowing window is placed at a center of that ridge; a step of burying both side portions of the ridge by burying layers, up to a position higher than the active layer; and a step of growing a first n-type blocking layer on each of the burying layers.

Effect of the Invention

According to the present application, since the current narrowing window for allowing a hole current to pass therethrough is provided at the top of ridge, it is possible to provide a semiconductor laser which is capable of increasing the power by reducing the hole-leakage current, and which can be manufactured without increasing the number of times of the crystal growth.

BRIEF DESCRIPTION OF THE DRAWINGS

FIGS. 6A to 6D are diagrams showing other manufacturing steps of the semiconductor laser according to Embodiment 1.

MODES FOR CARRYING OUT THE INVENTION

Embodiment 1

Figure 1:
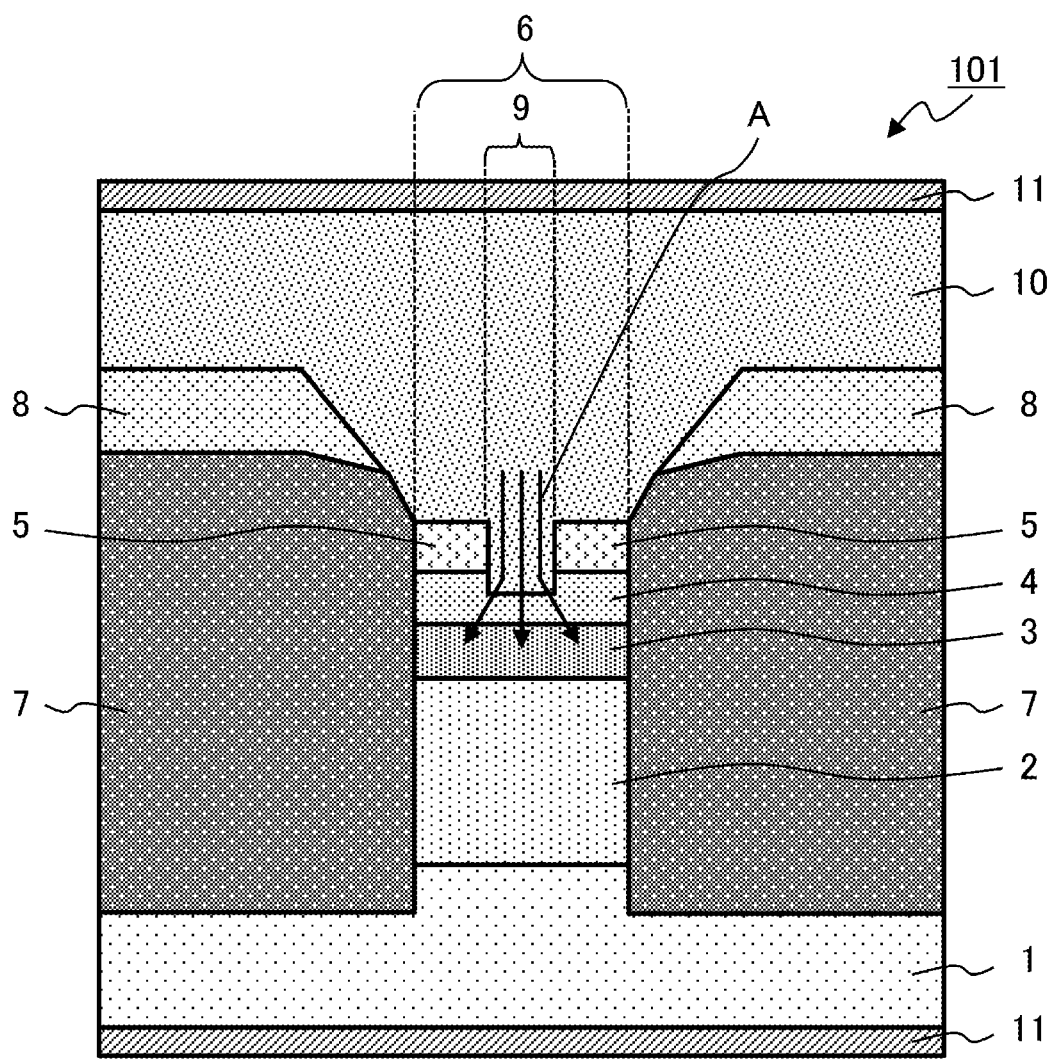
FIG. 1 is a cross-sectional view showing a configuration of a semiconductor laser according to Embodiment 1.

FIG. 1 is a cross-sectional view showing a configuration of a semiconductor laser 101 according to Embodiment 1.

As shown in FIG. 1, the semiconductor laser 101 has a structure provided with an active-layer ridge 6 composed of an n-type cladding layer 2, an active layer 3, a first p-type cladding layer 4 and a second n-type blocking layer 5 that are stacked in this order on an n-type InP substrate 1. The side surfaces of the active-layer ridge 6 are buried by burying layers 7 up to a position higher than the active layer 3, and first n-type blocking layers 8 are provided on the burying layers 7. Furthermore, the active-layer ridge 6, the burying layers 7 and the first n-type blocking layers 8 are buried by a second p-type cladding layer 10. Electrodes 11 are provided on the lower side of the n-type InP substrate 1 and on the upper side of the second p-type cladding layer 10.

The n-type InP substrate 1 is a substrate whose main plane is (001) plane and in which S is doped in a concentration of $4.0 \times 10^{18}$ cm$^{-3}$. The n-type cladding layer 2 is made of 0.3 μm-thick InP which is placed on the n-type InP substrate 1 and in which S is doped in a concentration of $4.0 \times 10^{18}$ cm$^{-3}$. The active layer 3 is made of an AlGaInAs-based or InGaAsP-based material including a multiple quantum well. The first p-type cladding layer 4 is made of 0.1 μm-thick InP in which Zn is doped in a concentration of $1.0 \times 10^{18}$ cm$^{-3}$. The second n-type blocking layer 5 is made of 0.1 μm-thick InP in which S is doped in a concentration of $7.0 \times 10^{18}$ cm$^{-3}$. The width of the active-layer ridge 6 is generally from about 0.8 to 1.4 μm; however, it is not limited to in this range.

The burying layers 7 are each made of InP in which Fe is doped in a concentration of $5.0 \times 10^{16}$ cm$^{-3}$, as a semi-insulative material. The first n-type blocking layers 8 are each made of 0.4 μm-thick InP which is placed on the burying layer 7 and in which S is doped in a concentration of $7.0 \times 10^{18}$ cm$^{-3}$. Note that the burying layer 7 may be of another semi-insulative material, such as, InP doped with another material of Ti, Co, Ru or the like. Further, the burying layer 7 may be formed as a combination with another semiconductor layer having a different impurity concentration or conductivity type.

Figure 2:
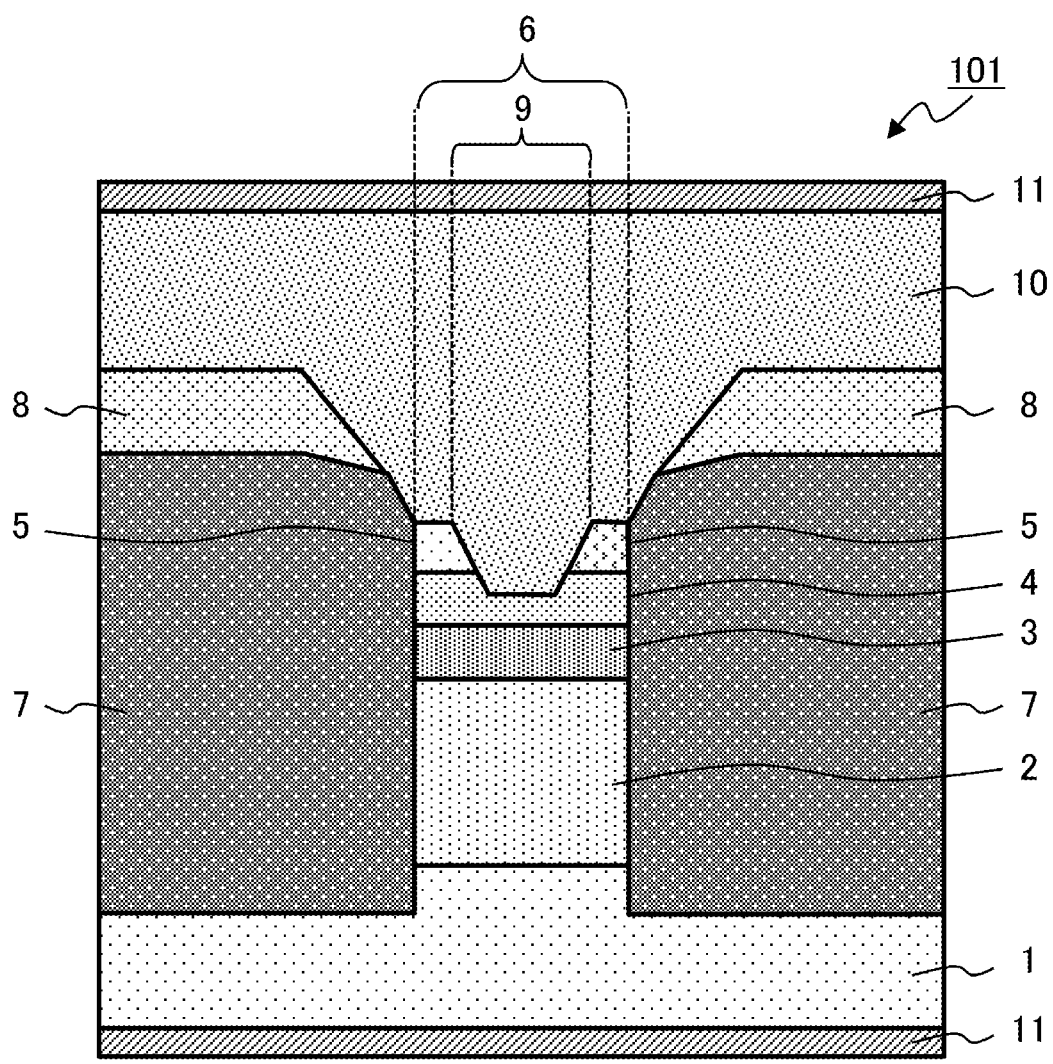
FIG. 2 is a cross-sectional view showing another configuration of the semiconductor laser according to Embodiment 1.

At the center of the upper portion (top center) of the active-layer ridge 6, there is a 0.7 μm-width region, namely, a current narrowing window 9, which is sandwiched between portions of the second n-type blocking layer 5. The width of the current narrowing window 9 is generally from about 0.5 to 1.0 μm; however, it is not limited to in this range so far as it is narrower than the width of the active-layer ridge 6. Further, side surfaces of the portions of the second n-type blocking layer 5, which are placed just on both sides of the current narrowing window 9, may be non-perpendicular to the n-type InP substrate 1, for example, may be inclined surfaces as shown in FIG. 2.

With respect a hole shape that constitutes the current narrowing window 9, its bottom plane is provided in and at the center of an upper portion of the active-layer ridge 6 so that it is lower than the second n-type blocking layer 5 but is placed in a range up to a position higher than the active layer 3. Furthermore, the hole shape that constitutes the current narrowing window 9 is, together with the active-layer ridge 6, the burying layers 7 and the first n-type blocking layers 8, buried by the second p-type cladding layer 10 made of 2.0-μm thick InP in which Zn is doped in a concentration of $3.0 \times 10^{18}$ cm$^{-3}$. The electrodes 11 on the lower side of the n-type InP substrate 1 and on the upper side of the second p-type cladding layer 10 are each made of a metal, such as Au, Ge, Zn, Pt, Ti or the like.

The front-end facet and the rear-end facet of the semiconductor laser 101 are each in (110) plane formed by cleavage, and thus form a resonator. Emitted light obtained in the active layer, due to injection of a current, is amplified in the resonator resulting in laser oscillation. Although the length of the resonator is set to from 150 µm to 300 µm in many cases, it is not limited to in this range.

When the current is injected through the upper and lower electrodes 11, electrons and holes are supplied, respectively, from the n-type InP substrate 1 and the n-type cladding layer 2 and from the first p-type cladding layer 4 and the second p-type cladding layer 10. The holes supplied from the second p-type cladding layer 10 flow out toward the n-type InP substrate 1. A part of these holes is blocked by a potential barrier placed at the interface between the second p-type cladding layer 10 and the first n-type blocking layer 8 or at the interface between the second p-type cladding layer 10 and the second n-type blocking layer 5.

The current of holes blocked as described above will pass through between the first n-type blocking layer 8 and the second n-type blocking layer 5, or through the current narrowing window 9, to flow toward the n-type InP substrate 1. At this time, the portion between the first n-type blocking layer 8 and the second n-type blocking layer 5 is 0.4 µm or less, thus narrower than the width of the current narrowing window 9, and further, it is in contact with the burying layer 7 that is higher in resistance than the p-type InP layer, so that its resistance is higher than that inside the current narrowing window 9. Accordingly, the hole current is likely to pass through the current narrowing window 9 having a lower resistance.

After passing through the current narrowing window 9, the hole current will, during passing through the first p-type cladding layer 4 to be injected into the active layer, get spread widthwise (hole-current flow A shown in FIG. 1). However, since the width of the current narrowing window 9 is narrower than the width of the active-layer ridge 6, holes spread widthwise can also be injected into the active layer 3. As a result, it is possible to improve the injection efficiency of holes in comparison with a conventional structure without having the second n-type blocking layer 5.

Figure 3:
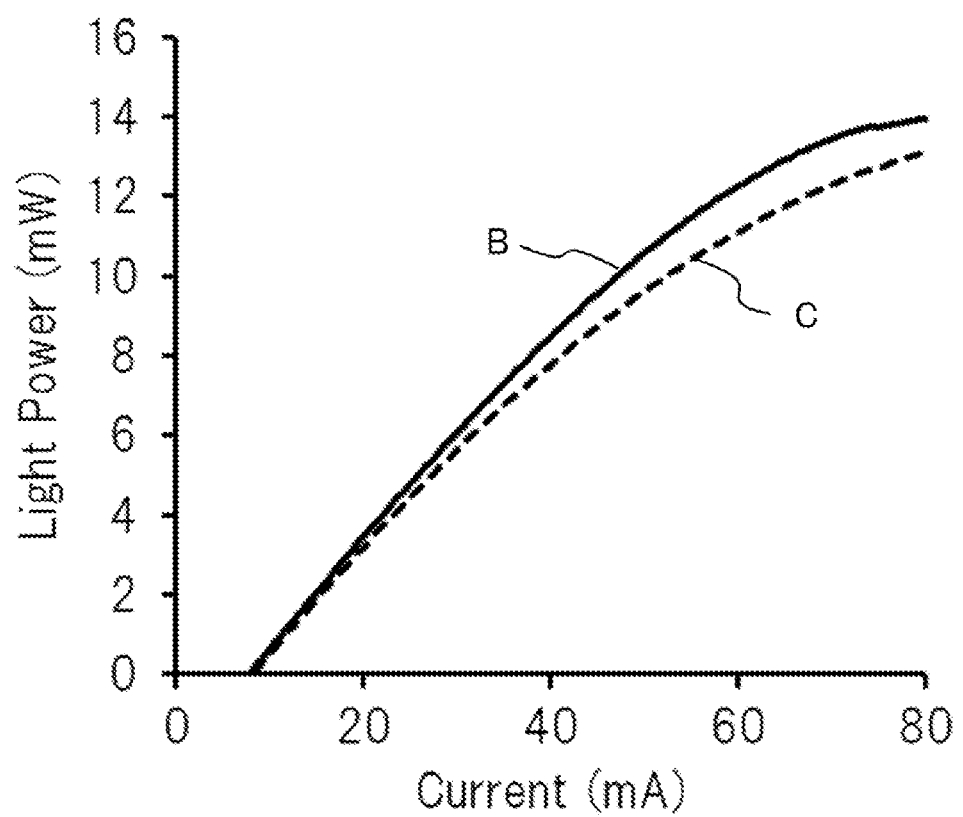
FIG. 3 is a diagram in which a current to light-power characteristic of the semiconductor laser according to Embodiment 1 is compared with that of a conventional semiconductor laser.

FIG. 3 is a diagram showing a current characteristic of the semiconductor laser 101 according to Embodiment 1. In FIG. 3, the abscissa represents a current supplied to the semiconductor laser, and the ordinate represents output power of the semiconductor laser. Note that the operation temperature was set to 95° C., and such a current to light-power characteristic was determined by calculation. As shown in FIG. 3, according to Current Characteristic B of the semiconductor laser 101, light power is obtained that is higher than that of Current Characteristic C of a conventional semiconductor laser, even under application of the same current. This is due to improvement in injection efficiency of the hole current into the active layer, of the semiconductor laser 101.

Figure 4:
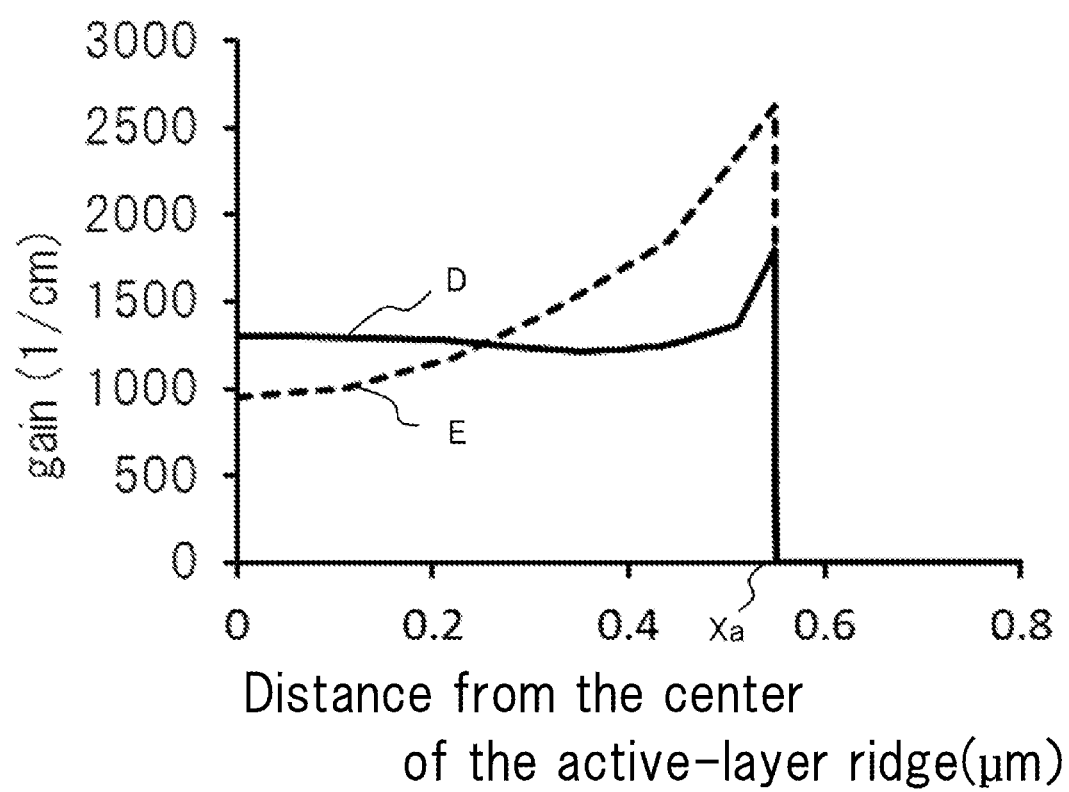
FIG. 4 is a diagram showing a calculation result of a lateral gain distribution in an active layer of the semiconductor laser according to Embodiment 1.

FIG. 4 is a diagram showing a calculation result of a lateral gain distribution in the active layer 3 of the semiconductor laser 101 according to Embodiment 1. In FIG. 4, the abscissa represents a lateral-direction distance from the center of the active-layer ridge, and the ordinate represents a gain. Symbol Xa corresponds to a side surface of the active-layer ridge. Note that the calculation result is that obtained under operation at a current value of 60 mA and at the operation temperature set to 95° C. As shown in FIG. 4, according to Gain E of the conventional semiconductor laser, the gain becomes larger as the distance to the side surface of the active-layer ridge becomes shorter; whereas, according to Gain D of the semiconductor laser 101, the gain distribution in the active layer as a whole is nearly uniform. When the gain distribution is so uniform, the injected amount of carriers required for laser oscillation also becomes uniform in the active layer as a whole. Thus, for example, in the case where intensity modulation is performed based on the current injection amount, the temporal fluctuation (jitter) becomes smaller, and this acts favorably in transmission of the modulated signal waveform.

The shape of the gain distribution of the semiconductor laser 101 can be explained as follows. In a light-intensity distribution of a general semiconductor laser which causes oscillation in a single mode, the intensity is largest at the center of the active layer (x=0) and attenuates with distance from the center. Therefore, at the center of the active layer where the light density is high, stimulated emission is more likely to occur than at the end portion of the active layer, and thus the hole density is likely to become lower. Thus, according to the semiconductor laser as shown in Patent Document 1, holes are injected almost uniformly and thus the hole density at the center of the active layer is reduced, so that the gain at the center of the active layer is reduced.

In contrast, the semiconductor laser as shown in Patent Document 2 has a structure in which the hole density at the center of the active layer is likely to become higher, because the current narrowing window that is narrower than the width of the active layer is placed on the active layer. Accordingly, even if the hole density at the center of the active layer is reduced due to carrier absorption, the hole density in the active layer as a whole is eventually more uniform than that of the semiconductor laser as shown in Patent Document 1, and thus the gain distribution is likely to be uniform as well.

In addition to achieving such effects, the semiconductor laser 101 according to Embodiment 1 does not require growing twice the n-type blocking layer separately in a manner as is done according to the semiconductor laser as shown in Patent Document 2. Accordingly, it is not required to increase the number of times of the crystal growth and thus, it is possible to improve characteristics of the semiconductor laser without causing reduction of the productivity and increase of the manufacturing cost.

Next, a manufacturing method of the semiconductor laser 101 according to Embodiment 1 will be described based on FIGS. 5A to 5D. FIGS. 5A to 5D are cross-sectional views showing manufacturing steps of the semiconductor laser 101 according to Embodiment 1.

Figure 5A:
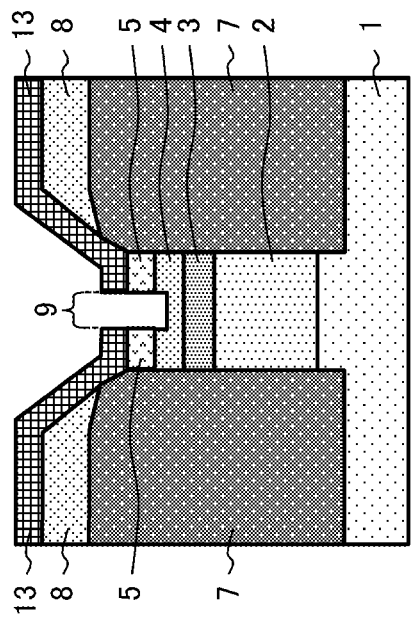
FIGS. 5A to 5D are diagrams showing manufacturing steps of the semiconductor laser according to Embodiment 1.

First, as shown in FIG. 5A, after the n-type cladding layer 2, the active layer 3, the first p-type cladding layer 4 and the second n-type blocking layer 5 are stacked in this order on the n-type InP substrate 1, an SiO2 mask 12 is deposited with a width corresponding to the active-layer ridge 6 and then, using the SiO2 mask 12, etching is performed up to an intermediate position in the n-type InP substrate 1, to thereby form the active-layer ridge 6. Note that, here, etching is performed up to an intermediate position in the n-type InP substrate 1; however, the position may instead be any position as long as it is lower than the active layer.

Figure 5C:
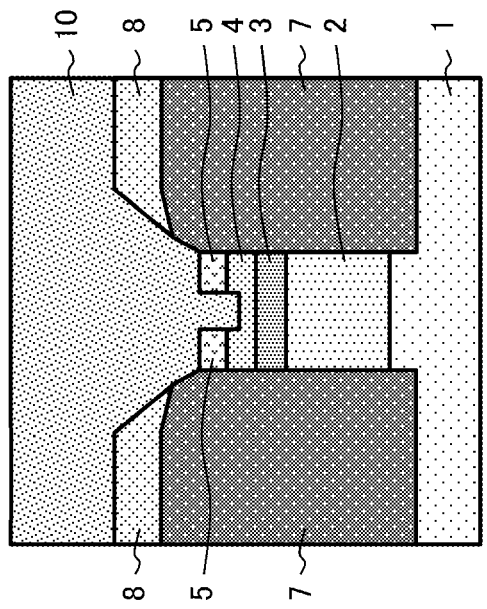
Figure 5B:
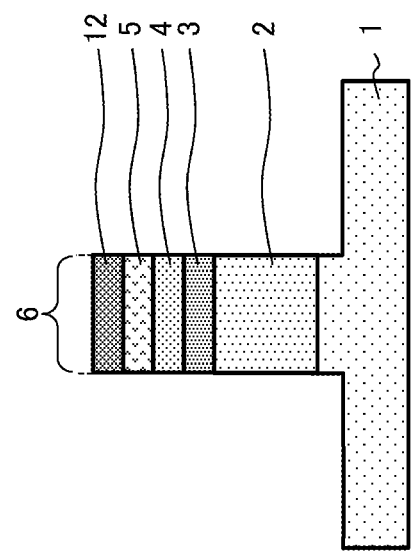

Subsequently, as shown in FIG. 5B, both side portions of the active-layer ridge 6 are buried by the burying layers 7 and the first n-type blocking layers 8, to thereby form a current narrowing structure.

Then, as shown in FIG. 5C, after removing the SiO2 mask 12 by using buffered hydrofluoric acid or hydrofluoric acid, an SiO2 mask 13 is deposited and a hole for the current narrowing window 9 is created by etching in the SiO2 mask 13 at a position corresponding to the center of the upper portion of the active-layer ridge 6 and then, using the SiO2 mask 13 in which the hole is created, the current narrowing window 9 is formed in and at the center of the upper portion of the active-layer ridge 6. At this time, the bottom plane of the hole shape that constitutes the current narrowing window 9 is created in and at the center of the upper portion of the active-layer ridge 6 so that it is placed in a range from the back surface of the second n-type blocking layer 5 up to a position higher than the active layer 3.

Figure 5D:
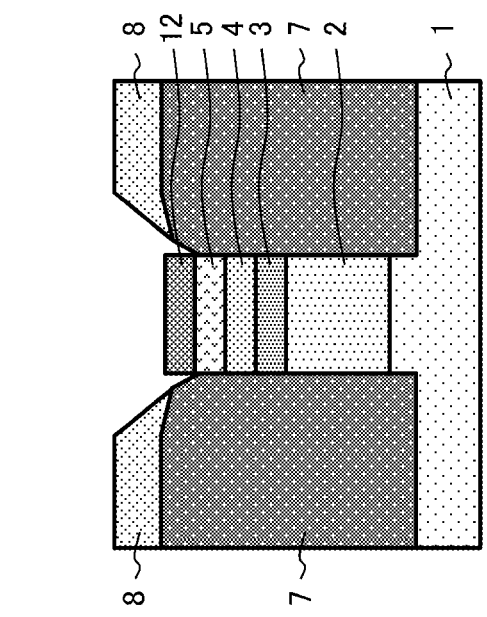

Subsequently, as shown in FIG. 5D, after removing the SiO2 mask 13 by using buffered hydrofluoric acid or hydrofluoric acid, the upper portion of the active-layer ridge 6 and the hole shape that constitutes the current narrowing window 9 are buried by the second p-type cladding layer 10. Lastly, the electrodes 11 are formed on the lower side of the n-type InP substrate 1 and the upper side of the second p-type cladding layer 10, so that the semiconductor laser 101 shown in FIG. 1 is completed.

It is noted that, in the foregoing case of Embodiment 1, the active-layer ridge 6 is formed first by etching and thereafter, the current narrowing window 9 is formed; however, it is allowed that the current narrowing window 9 is formed first and thereafter, the active-layer ridge 6 is formed. Another manufacturing method of the semiconductor laser 101 according to Embodiment 1 will be described based on FIGS. 6A to 6D. FIGS. 6A to 6D are cross-sectional views showing other manufacturing steps of the semiconductor laser 101 according to Embodiment 1.

First, as shown in FIG. 6A, after the n-type cladding layer 2, the active layer 3, the first p-type cladding layer 4 and the second n-type blocking layer 5 are stacked in this order on the n-type InP substrate 1, an SiO2 mask 12 is deposited and a hole for the current narrowing window 9 is created by etching in the SiO2 mask 12 at a position corresponding to the center of the upper portion of the active-layer ridge 6 to be provided and then, using the SiO2 mask 12 in which the hole is created, the current narrowing window 9 is formed at the center of the upper portion of the active-layer ridge 6. At this time, the bottom plane of the hole shape that constitutes the current narrowing window 9 is created in and at the center of the upper portion of the active-layer ridge 6 so that it is placed in a range from the back surface of the second n-type blocking layer 5 up to a position higher than the active layer 3.

Subsequently, as shown in FIG. 6B, after removing the SiO2 mask 12 by using buffered hydrofluoric acid or hydrofluoric acid, an SiO2 mask 13 is deposited on the second n-type blocking layer 5, with a width corresponding to the active-layer ridge 6 and then, using the mask, etching is performed up to an intermediate position in the n-type InP substrate 1, to thereby form the active-layer ridge 6. Note that, here, etching is performed up to an intermediate position in the n-type InP substrate 1; however, the position may instead be any position as long as it is lower than the active layer.

Then, as shown in FIG. 6C, both side portions of the active-layer ridge 6 are buried by the burying layers 7 and the first n-type blocking layers 8, to thereby form a current narrowing structure.

Subsequently, as shown in FIG. 6D, after removing the SiO2 mask 13 by using buffered hydrofluoric acid or hydrofluoric acid, the upper portion of the active-layer ridge 6 and the current narrowing window 9 are buried by the second p-type cladding layer 10. Lastly, the electrodes 11 are formed on the lower side of the n-type InP substrate 1 and the upper side of the second p-type cladding layer 10, so that the semiconductor laser 101 shown in FIG. 1 is completed.

As described above, according to the semiconductor laser 101 according to Embodiment 1, it comprises: the active-layer ridge 6 which is composed of the n-type cladding layer 2, the active layer 3, the first p-type cladding layer 4 and the second n-type blocking layer 5 that are stacked in this order on the n-type InP substrate 1, and which is formed to project from a position lower than the active layer 3 (a position nearer to the n-type InP substrate 1); burying layers 7 by which both side portions of the active-layer ridge 6 are buried up to a position higher than the active layer 3; first n-type blocking layers 8 which are each stacked on a front-surface side of each of the burying layers 7, to be placed on both sides of the active-layer ridge 6; and the second p-type cladding layer 10 by which a top of the active-layer ridge and the first n-type blocking layers 8 are buried thereunder; wherein the current narrowing window 9 for allowing a hole current to pass therethrough is provided in and at the center of the second n-type blocking layer 5 placed at the top of the active-layer ridge 6. Thus, it is possible to provide a semiconductor laser which is capable of increasing the power by reducing the hole-leakage current, and which can be manufactured without increasing the number of times of the crystal growth.

Figure 7:
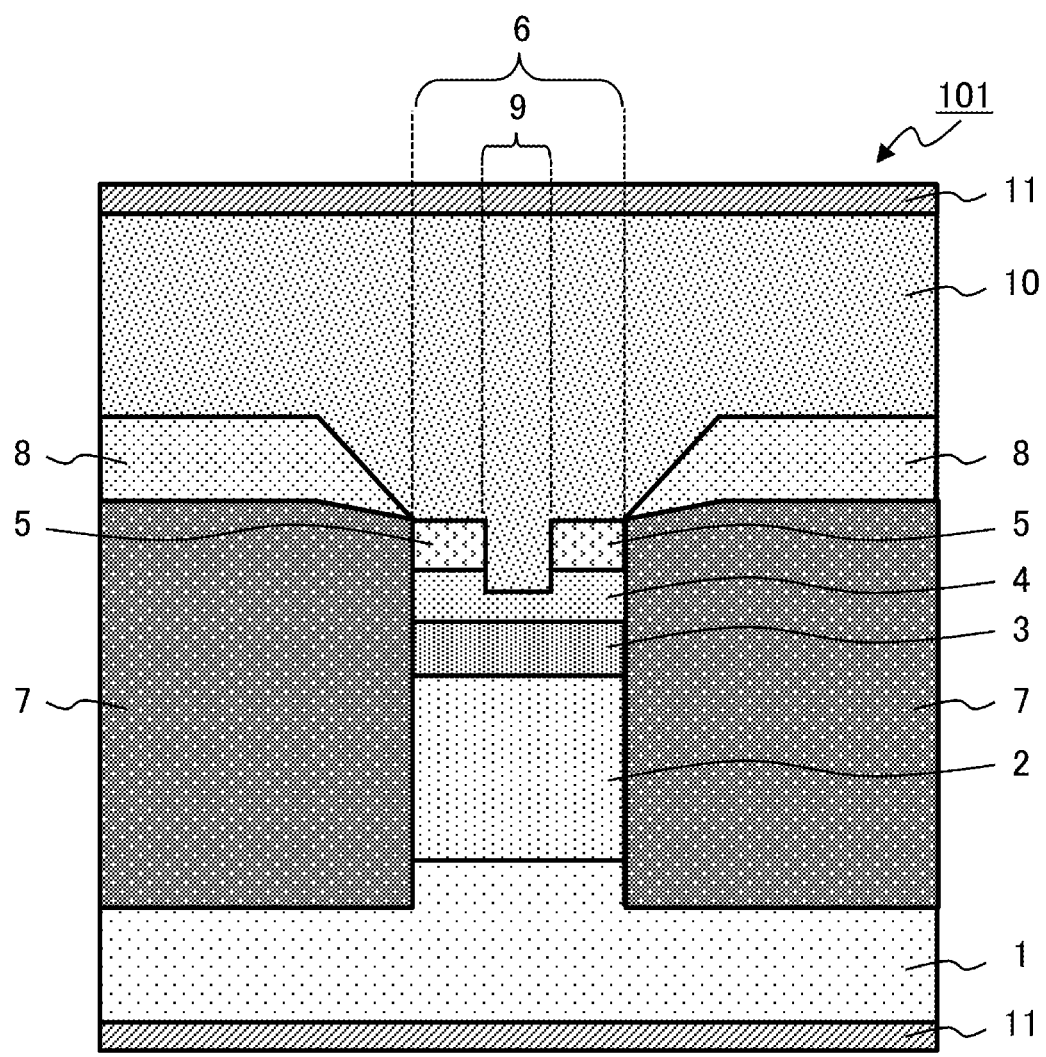
FIG. 7 is a cross-sectional view showing another configuration of the semiconductor laser according to Embodiment 1.

It is noted that, in Embodiment 1, the first n-type blocking layer 8 and the second n-type blocking layer 5 are so configured that the burying layer 7 of high resistance is sandwiched therebetween; however, this is not limitative. As shown in FIG. 7, the first n-type blocking layer 8 and the second n-type blocking layer 5 may be so configured that the burying layer 7 is not sandwiched therebetween and thus, the first n-type blocking layer 8 and the second n-type blocking layer 5 are in contact with each other.

With this configuration, when current injection is performed, holes supplied from the second p-type cladding layer 10 are blocked by a potential barrier at the interface between the second p-type cladding layer 10 and the first n-type blocking layer 8 or at the interface between the second p-type cladding layer 10 and the second n-type blocking layer 5. The current of holes blocked as described above will pass through the current narrowing window 9 and will be then injected into the active layer 3. Accordingly, unlike the foregoing case of Embodiment 1, it is possible to prevent a hole-leakage current from passing through between the first n-type blocking layer 8 and the second n-type blocking layer 5 to flow into the burying layer 7. This improves the injection efficiency of holes into the active layer more than in the foregoing case of Embodiment 1, and thus the power of laser can be more increased.

Embodiment 2

In Embodiment 1, the current narrowing window 9 sandwiched between portions of the second n-type blocking layer 5 is used; however, in Embodiment 2, a case will be described where the formation of the second n-type blocking layer 5 is omitted and a current narrowing window is formed in such a manner that an insulative region is provided in the first p-type cladding layer 4.

Figure 8:
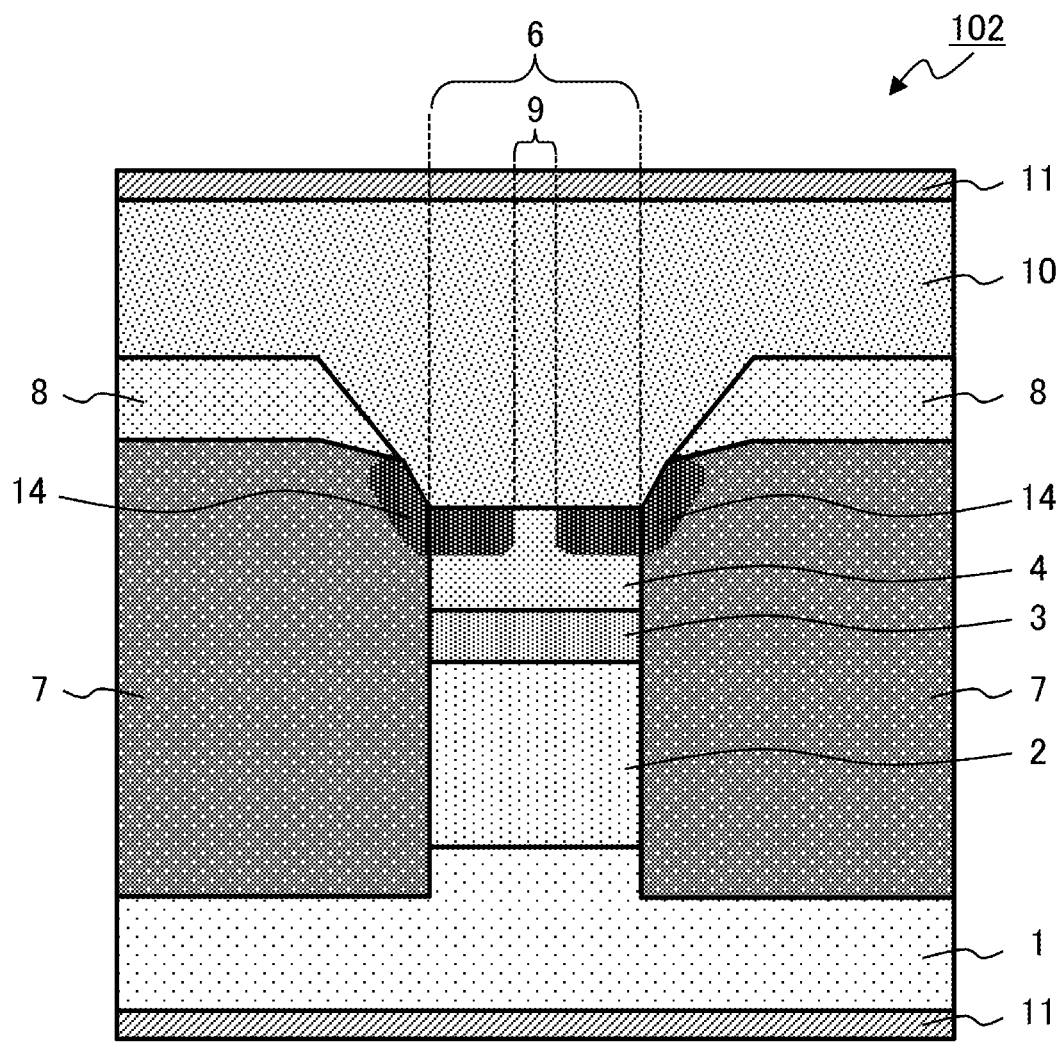
FIG. 8 is a cross-sectional view showing a configuration of a semiconductor laser according to Embodiment 2.

FIG. 8 is a cross-sectional view showing a configuration of a semiconductor laser 102 according to Embodiment 2. As shown in FIG. 8, in Embodiment 2, a current narrowing window 9 is formed in such a manner that, with respect to an active-layer ridge 6 in which an n-type cladding layer 2, an active layer 3 and a first p-type cladding layer 4 are stacked in this order, an insulative region 14 is provided to be placed in both end portions of the first p-type cladding layer 4 as an upper portion of the active-layer ridge, and in portions of the burying layers 7 each placed between the active-layer ridge 6 and the first n-type blocking layer 8. The configuration of the semiconductor laser 102 other than the above is the same as in the semiconductor laser 101 of Embodiment 1, so that description thereof will be omitted.

In Embodiment 2, the insulative region 14 is prepared, for example, as follows.

After the side surfaces of the active-layer ridge 6 are buried by the burying layers 7 and the first n-type blocking layers 8, a mask using $SiO_2$ is formed on and at the center of the first p-type cladding layer 4 as the upper portion of the active-layer ridge 6, to be placed at a position corresponding to a position where the current narrowing window 9 is to be provided, followed by injection of protons from the upper side thereof. This converts a portion of the first p-type cladding layer 4 other than that beneath the $SiO_2$ mask, into an insulator. On the other hand, the portion beneath the $SiO_2$ mask remains the same as the first p-type cladding layer 4 and thus functions as the current narrowing window 9. Except for how the current narrowing window 9 is formed, the manufacturing method of the semiconductor laser 102 is the same as that of the semiconductor laser 101 of Embodiment 1, so that description thereof will be omitted.

As described above, according to the semiconductor laser 102 according to Embodiment 2, the current narrowing window 9 is formed in such a manner that, in the first p-type cladding layer 4, a region corresponding to the region other than the current narrowing window 9 is converted into an insulator. Thus, it is possible to achieve effects similar to those in Embodiment 1, and further to provide a semiconductor laser that is superior in flatness of the outermost surface of the second p-type cladding layer because the current narrowing window can be prepared without the step to be buried by that layer.

Embodiment 3

In Embodiment 2, the current narrowing window 9 is formed in such a manner that both end portions of the first p-type cladding layer 4 as the upper portion of the active-layer ridge 6 are converted into insulative portions; however, in Embodiment 3, a case will be described where a current narrowing window is formed in such a manner that a diffused region of p-type dopants is provided in the second p-type blocking layer.

Figure 9:
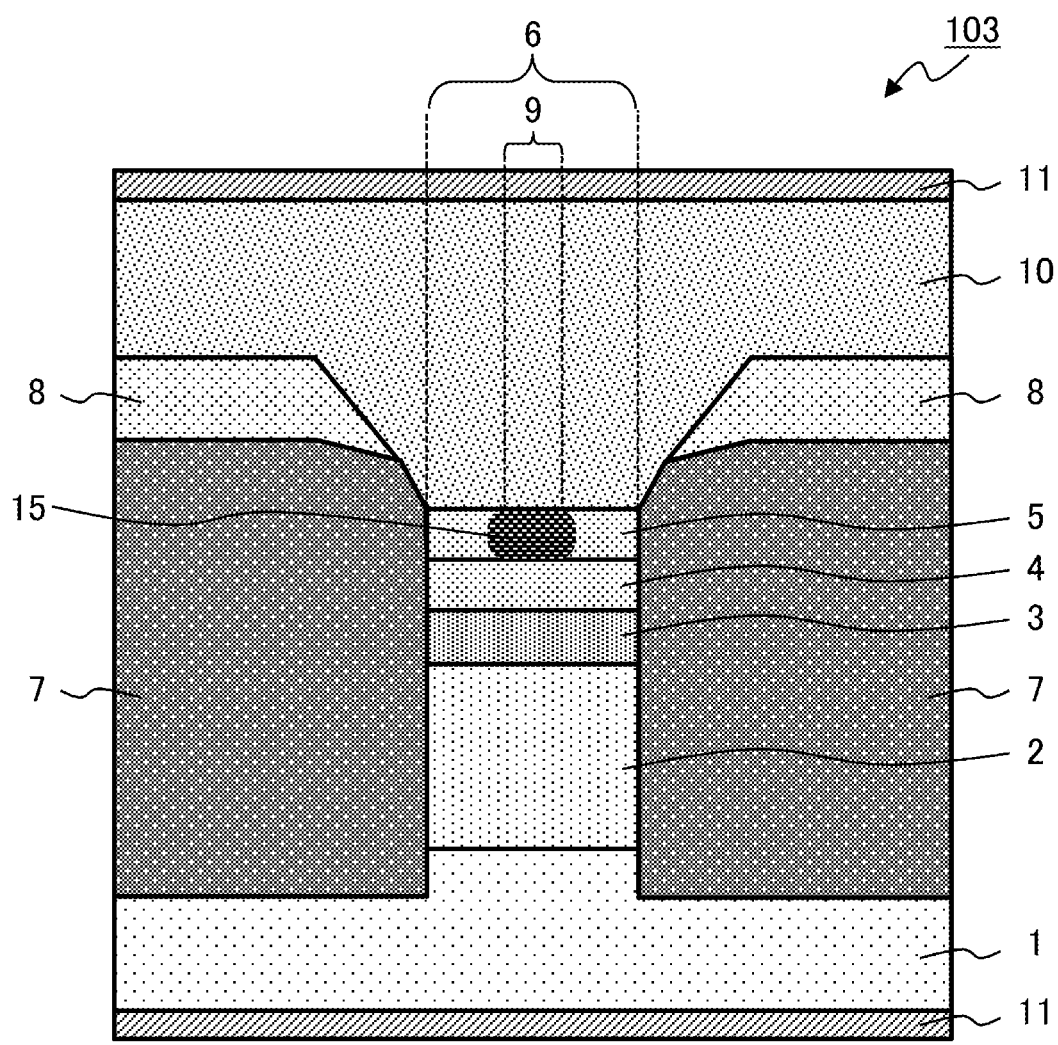
FIG. 9 is a cross-sectional view showing a configuration of a semiconductor laser according to Embodiment 3.

FIG. 9 is a cross-sectional view showing a configuration of a semiconductor laser 103 according to Embodiment 3. As shown in FIG. 9, in Embodiment 3, a current narrowing window 9 is formed in such a manner that, a diffused region 15 of p-type dopants of, for example, Zn, is provided in and at the center of the second n-type blocking layer 5 as the upper portion of the active-layer ridge 6. The configuration of the semiconductor laser 103 other than the above is the same as in the semiconductor laser 101 of Embodiment 1, so that description thereof will be omitted.

In Embodiment 3, the diffused region 15 is prepared, for example, as follows.

Using a photoresist, its patterning corresponding to a hole shape is performed on and at the center of the second n-type blocking layer 5, and thereafter, ZnO is deposited by a sputtering method on the upper side and then, portions of ZnO and the resist, other than those at the position corresponding to the diffused region to be provided, are removed by lift-off. Thereafter, annealing is performed, so that the p-type dopant diffused region 15 can be formed only at the center of the second n-type blocking layer 5. With respect to the sequence of preparation, it does not matter whichever the active-layer ridge 6 is formed first or the active-layer ridge 6 is formed after formation of the p-type dopant diffused region 15. Except for how the current narrowing window 9 is formed, the manufacturing method of the semiconductor laser 103 is the same as that of the semiconductor laser 101 of Embodiment 1, so that description thereof will be omitted.

As described above, according to the semiconductor laser 103 according to Embodiment 3, the current narrowing window 9 is formed in such a manner that p-type dopants are diffused in a region of the second n-type blocking layer 5 corresponding to the current narrowing window. Thus, it is possible to achieve effects similar to those in Embodiment 1, and further to provide a semiconductor laser that is superior in flatness of the outermost surface of the second p-type cladding layer because the current narrowing window can be prepared without the step to be buried by that layer.

Embodiment 4

In Embodiment 1, the current narrowing window 9 provided with a hole shape is formed in the second n-type blocking layer 5; while, in Embodiment 4, a case will be described where a third p-type cladding layer 16 is formed that covers the second n-type blocking layer 5 in which the current narrowing window 9 is provided.

Figure 10:
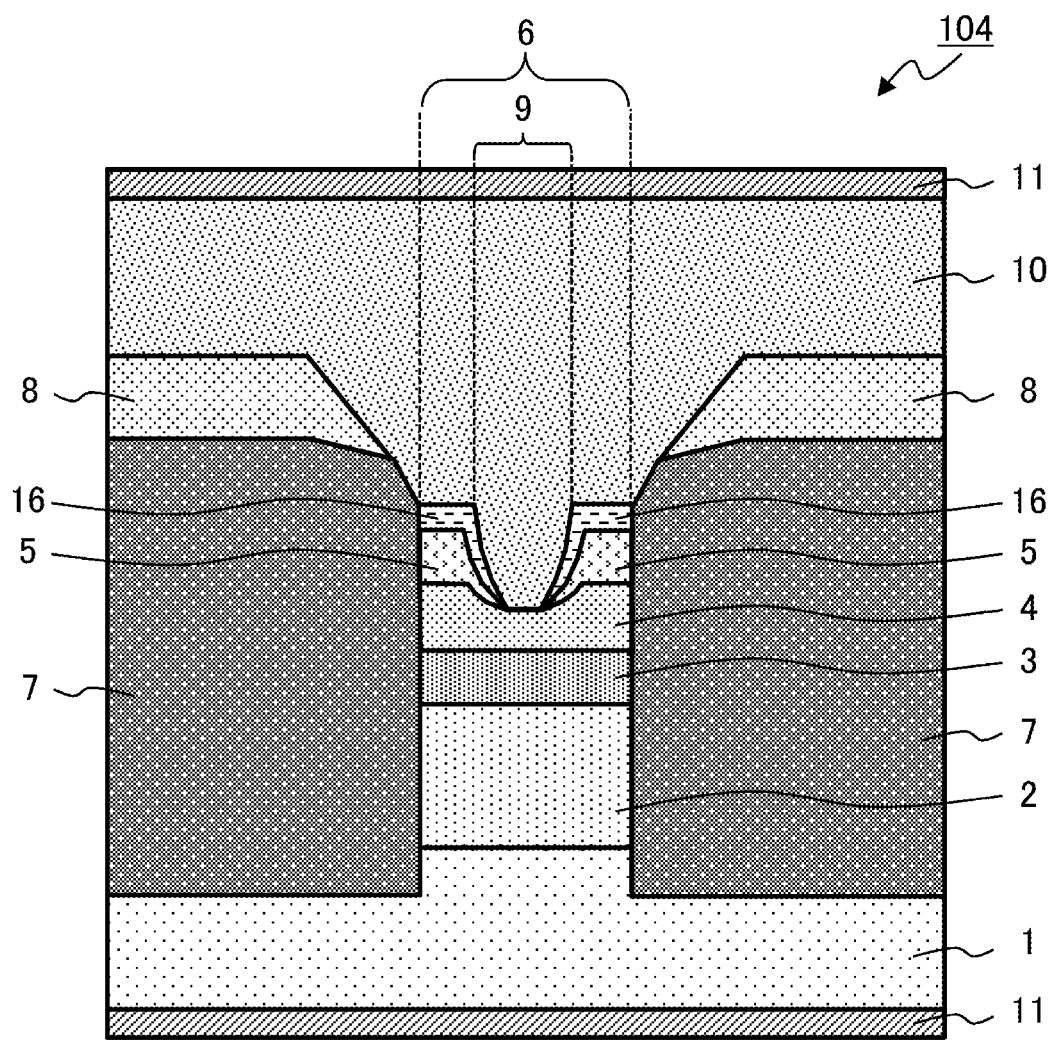
FIG. 10 is a cross-sectional view showing a configuration of a semiconductor laser according to Embodiment 4.

FIG. 10 is a cross-sectional view showing a configuration of a semiconductor laser 104 according to Embodiment 4. As shown in FIG. 10, in Embodiment 4, the second n-type blocking layer 5 in which the current narrowing window 9 is provided, is covered with the third p-type cladding layer 16 made of 0.1 μm-thick InP in which Zn is doped in a concentration of $3.0 \times 10^{18}$ $cm^{-3}$. The configuration of the semiconductor laser 104 other than the above is the same as in the semiconductor laser 101 of Embodiment 1, so that description thereof will be omitted.

Figure 11:
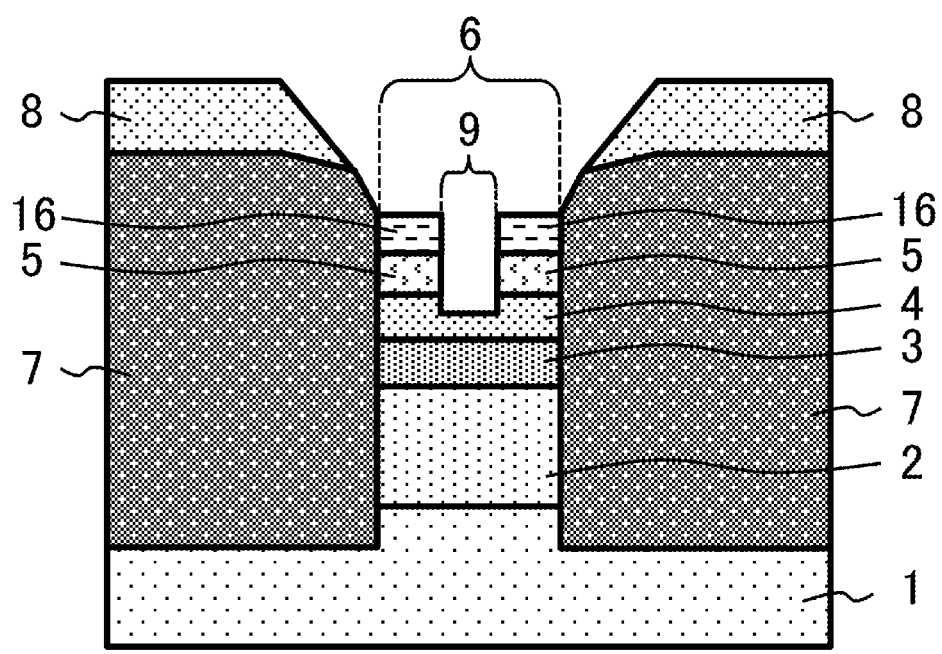
FIG. 11 is a cross-sectional view for explaining a manufacturing method of the semiconductor laser according to Embodiment 4.

In Embodiment 4, the third p-type cladding layer 16 that covers the second n-type blocking layer 5 is prepared, for example, as follows. FIG. 11 is a cross-sectional view of the semiconductor laser 104 before formation of the second p-type cladding layer 10. As shown in FIG. 11, after the third p-type cladding layer 16 is stacked on the second n-type blocking layer 5, a hole for providing the current narrowing window 9 is created. Subsequently, when the second p-type cladding layer 10 is to be formed, in the crystal-growing furnace for MOCVD, the in-furnace temperature is elevated up to about 500° C., so that, as shown in FIG. 10, portions of the semiconductor layers that constitute both walls of the current narrowing window 9, are deformed due to mass transport. On this occasion, if the uppermost portion of the active-layer ridge 6 is the second n-type blocking layer 5, there is such a risk that the deformed n-type InP portions fall into the current narrowing window 9 and onto the first p-type cladding layer 4, to thereby close a hole-current injection path toward the active layer 3. In this respect, when the uppermost portion of the active-layer ridge 6 is the third p-type cladding layer 16 as in Embodiment 4, if it falls into the current narrowing window, since it is made of p-type InP with the same polarity as that of the second p-type cladding layer 10 for burying the current narrowing window, the hole-current injection path is never closed. Except for how the current narrowing window 9 is formed, the manufacturing method of the semiconductor laser 104 is the same as that of the semiconductor laser 101 of Embodiment 1, so that description thereof will be omitted.

As described above, according to Embodiment 4, the second n-type blocking layer 5 in which the current narrowing window 9 is provided, is covered with the third p-type cladding layer 16. Thus, it is possible to provide a semiconductor laser which does not cause the hole-current injection path to be closed, and is thus superior in current characteristics.

Embodiment 5

In Embodiment 1, the current narrowing window 9 is buried by the second p-type cladding layer 10; however, in Embodiment 5, a case will be described where it is buried by a fourth p-type cladding layer 17.

Figure 12:
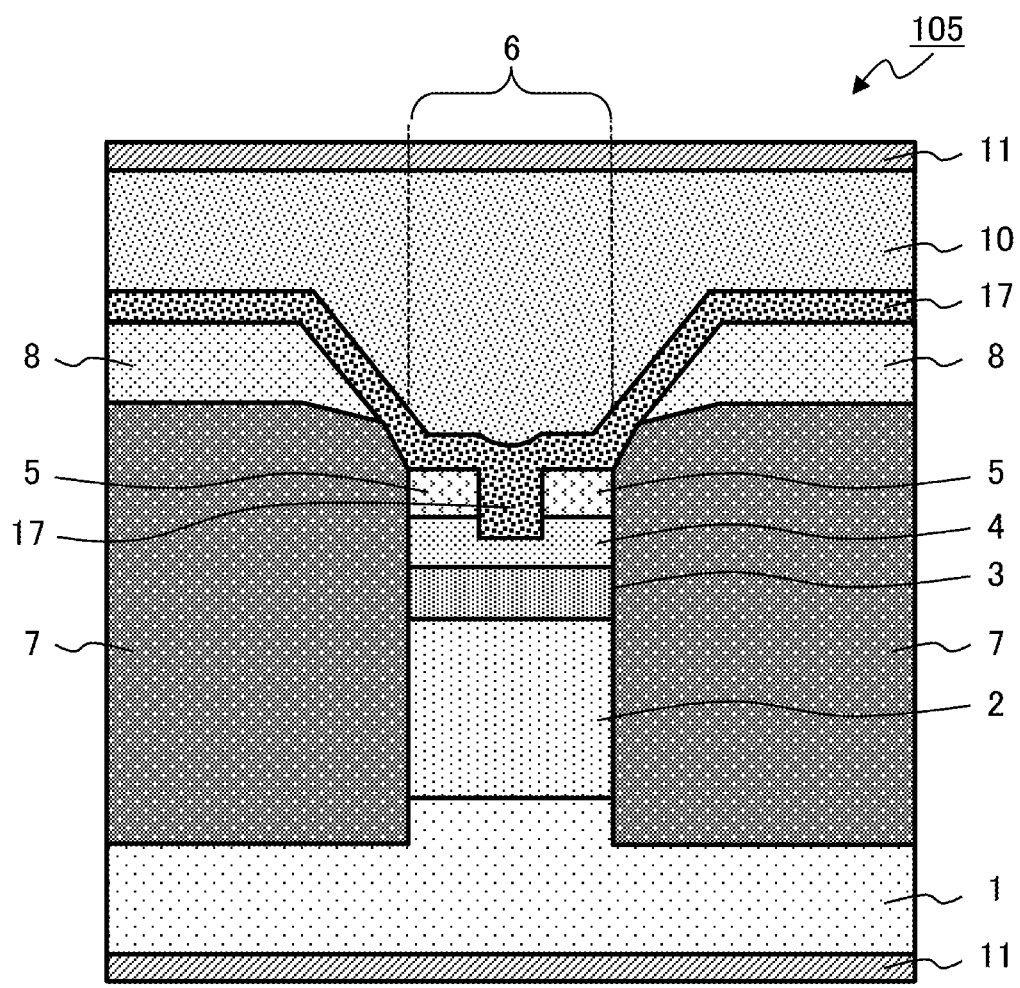
FIG. 12 is a cross-sectional view showing a configuration of a semiconductor laser according to Embodiment 5.

FIG. 12 is a cross-sectional view showing a configuration of a semiconductor laser 105 according to Embodiment 5. As shown in FIG. 12, in Embodiment 5, the current narrowing window 9 is buried by the fourth p-type cladding layer 17 that is higher in carrier concentration than the second p-type cladding layer 10. For example, the fourth p-type cladding layer 17 is 0.2 µm-thick p-type InP in which Zn is doped in a concentration of $3.0\times10^{18}$ cm$^{-3}$, and the second p-type cladding layer 10 is 1.8 µm-thick p-type InP in which Zn is doped in a concentration of $1.0\times10^{18}$ cm$^{-3}$. The configuration of the semiconductor laser 105 other than the above is the same as in the semiconductor laser 101 of Embodiment 1, so that description thereof will be omitted.

According to Embodiment 5, after the current narrowing window 9 sandwiched between portions of the second n-type blocking layer 5 is buried by the fourth p-type cladding layer 17, the second p-type cladding layer 10 that is lower in carrier concentration than the fourth p-type cladding layer 17 is crystal-grown. Except for the burying step by the fourth p-type cladding layer 17, the manufacturing method of the semiconductor laser 105 is the same as that of the semiconductor laser 101 of Embodiment 1, so that description thereof will be omitted.

In comparison with a semiconductor laser without having the current narrowing window 9, the semiconductor laser having the current narrowing window 9 is smaller in cross-section of the current flowing region, and thus has a problem that the element resistance becomes higher. In order to solve the problem, it would be appropriate to increase the carrier concentration of the second p-type cladding layer for burying the current narrowing window 9, to thereby reduce the resistance of the current flowing region. However, if the carrier concentration is so increased, light absorption loss becomes larger, to thereby reduce the light power. For that reason, the light generated from the active layer must be prevented as much as possible from leaking out to a semiconductor layer whose carrier concentration is high. In Embodiment 5, only the carrier concentration of the fourth p-type cladding layer for burying the current narrowing window 9 is made high, and the carrier concentration of the second p-type cladding layer thereon is made lower than that of the fourth p-type cladding layer, so that reduction of the element resistance and suppression of the light absorption loss are both ensured.

As described above, according to the semiconductor laser 105 according to Embodiment 5, since the carrier concentration of the second p-type cladding layer 10 is set lower than that of the fourth p-type cladding layer 17 for burying the current narrowing window 9, the light absorption loss can be made lower than that of the semiconductor laser of Embodiment 1. Thus, such effects are provided that the threshold current is reduced and that the light power is increased.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the description of this application. For example, such cases shall be included where at least one configuration element is modified; where any configuration element is added or omitted; and furthermore, where at least one configuration element is extracted and combined with a configuration element of another embodiment.

DESCRIPTION OF REFERENCE NUMERALS AND SIGNS

1: n-type InP substrate, 2: n-type cladding layer, 3: active layer, 4: first p-type cladding layer, 5: second n-type blocking layer, 6: active-layer ridge, 7: burying layer, 8: first n-type blocking layer, 9: current narrowing window, 10: second p-type cladding layer.

The invention claimed is:

1. A semiconductor laser, comprising:
a ridge which is composed of an n-type cladding layer, an active layer, a first p-type cladding layer and a second n-type blocking layer that are stacked in this order on an n-type substrate, and which is formed to project from a position nearer to the n-type substrate than to the active layer;
burying layers by which both side portions of the ridge are buried up to a position higher than the active layer;
first n-type blocking layers which are each stacked on a front-surface side of each of the burying layers, to be placed on both sides of the ridge; and
a second p-type cladding layer by which a top of the ridge and the first n-type blocking layers are buried thereunder;
wherein a current narrowing window for allowing a hole current to pass therethrough is provided in and at a center of the second n-type blocking layer placed at the top of the ridge.

2. The semiconductor laser according to claim 1, wherein the current narrowing window is provided with a hole shape, and the hole shape is buried by the second p-type cladding layer.

3. The semiconductor laser according to claim 2, wherein the hole shape is created not only in the second n-type blocking layer placed at the top of the ridge, but also over a range up to a position between said blocking layer and the active layer.

4. The semiconductor laser according to claim 3, wherein the second n-type blocking layer for the current narrowing window is covered with a third p-type cladding layer.

5. The semiconductor laser according to claim 3, wherein the current narrowing window is instead buried by a fourth p-type cladding layer that is higher in carrier concentration than the second p-type cladding layer.

6. The semiconductor laser according to claim 3, wherein the first n-type blocking layer is in contact with the second n-type blocking layer.

7. The semiconductor laser according to claim 2, wherein the second n-type blocking layer for the current narrowing window is covered with a third p-type cladding layer.

8. The semiconductor laser according to claim 2, wherein the first n-type blocking layer is in contact with the second n-type blocking layer.

9. The semiconductor laser according to claim 1, wherein the current narrowing window is formed in such a manner that p-type dopants are diffused in a region of the second n-type blocking layer corresponding to the current narrowing window.

10. The semiconductor laser according to claim 9, wherein the first n-type blocking layer is in contact with the second n-type blocking layer.

11. The semiconductor laser according to claim 1, wherein the second n-type blocking layer for the current narrowing window is covered with a third p-type cladding layer.

12. The semiconductor laser according to claim 11, wherein the first n-type blocking layer is in contact with the second n-type blocking layer.

13. The semiconductor laser according to claim 1, wherein the current narrowing window is instead buried by a fourth p-type cladding layer that is higher in carrier concentration than the second p-type cladding layer.

14. The semiconductor laser according to claim 13, wherein the first n-type blocking layer is in contact with the second n-type blocking layer.

15. The semiconductor laser according to claim 1, wherein the first n-type blocking layer is in contact with the second n-type blocking layer.

16. The semiconductor laser according to claim 1, wherein the n-type substrate is an InP substrate, and the burying layers are each a Fe-doped InP layer or a Ru-doped InP layer.

17. A semiconductor laser, comprising:
   a ridge which is composed of an n-type cladding layer, an active layer and a first p-type cladding layer that are stacked in this order on an n-type substrate, and which is formed to project from a position nearer to the n-type substrate than to the active layer;
   burying layers by which both side portions of the ridge are buried up to a position higher than the active layer;
   first n-type blocking layers which are each stacked on a front-surface side of each of the burying layers, to be placed on both sides of the ridge;
   a second p-type cladding layer by which a top of the ridge and the first n-type blocking layers are buried thereunder; and
   a current narrowing window for allowing a hole current to pass therethrough, which is provided in and at a center of the first p-type cladding layer placed at the top of the ridge;
   wherein the current narrowing window is formed in such a manner that, in the first p-type cladding layer, a region corresponding to a region other than the current narrowing window is converted into an insulator.

18. The semiconductor laser according to claim 17, wherein the n-type substrate is an InP substrate, and the burying layers are each a Fe-doped InP layer or a Ru-doped InP layer.

19. A method for manufacturing a semiconductor laser, comprising:
   a step of stacking an n-type cladding layer, an active layer, a first p-type cladding layer and a second n-type blocking layer, in this order, on an n-type substrate, and thereafter, etching both side portions of thus stacked layers up to a position nearer to the n-type substrate than to the active layer, to thereby form a ridge;
   a step of burying both side portions of the ridge by burying layers, up to a position higher than the active layer;
   a step of growing a first n-type blocking layer on each of the burying layers; and
   a step of providing a current narrowing window in and at a center of the second n-type blocking layer placed at a top of the ridge.

* * * * *